(12) United States Patent
Abe et al.

(10) Patent No.: US 7,733,445 B2
(45) Date of Patent: Jun. 8, 2010

(54) DISPLAY DEVICE FOR REDUCING CHROMATICITY DIFFERENCE IN WHITE COLOR AND METHOD FOR MANUFACTURING THE SAME

(75) Inventors: Makoto Abe, Sendai (JP); Tsutomu Tanaka, Sendai (JP)

(73) Assignee: Future Vision Inc., Tokyo (JP)

( * ) Notice: Subject to any disclaimer, the term of this patent is extended or adjusted under 35 U.S.C. 154(b) by 557 days.

(21) Appl. No.: 11/606,182

(22) Filed: Nov. 30, 2006

(65) Prior Publication Data

US 2008/0002113 A1    Jan. 3, 2008

(30) Foreign Application Priority Data

Jun. 30, 2006 (JP) .............................. 2006-180841

(51) Int. Cl.
 *G02F 1/1335* (2006.01)
(52) U.S. Cl. ...................... 349/107; 349/106; 349/108; 349/109; 349/80
(58) Field of Classification Search ......... 349/106–109, 349/79–80
See application file for complete search history.

(56) References Cited

U.S. PATENT DOCUMENTS 7,002,647 B2 * 2/2006 Tanaka ...................... 349/107

2006/0227264 A1 * 10/2006 Noda ......................... 349/108
2007/0015429 A1 * 1/2007 Maeda et al. .................. 445/24
2007/0132920 A1 * 6/2007 Suzuki et al. ............... 349/107

FOREIGN PATENT DOCUMENTS

JP         04-166915        6/1992
JP       08122803 A  *     5/1996

* cited by examiner

*Primary Examiner*—Hemang Sanghavi
(74) *Attorney, Agent, or Firm*—Antonelli, Terry, Stout & Kraus, LLP.

(57) ABSTRACT

Chromaticity difference is decreased, which is caused by the difference of transmissivity when a light passes through a transparent conductive film to constitute pixels. Optical film thickness of each of transparent conductive films PXR, PXG, and PXB to constitute pixels (a product "nd" of refractive index "n" and film thickness "d") is varied for each of color filters RF, GF, and BF for each pixel. The transparent conductive film is prepared by coating an ink (produced by dispersing fine particles of a transparent conductive film material such as ITO in a binder) via nozzle of an ink jet device, and then, by baking. Film thickness is controlled by the coating amount of the ink, and refractive index is controlled by volume ratio of the fine particles of conductive material to the binder contained in the transparent conductive film in consideration of those refractive indices.

6 Claims, 16 Drawing Sheets

FIG. 8
(a)
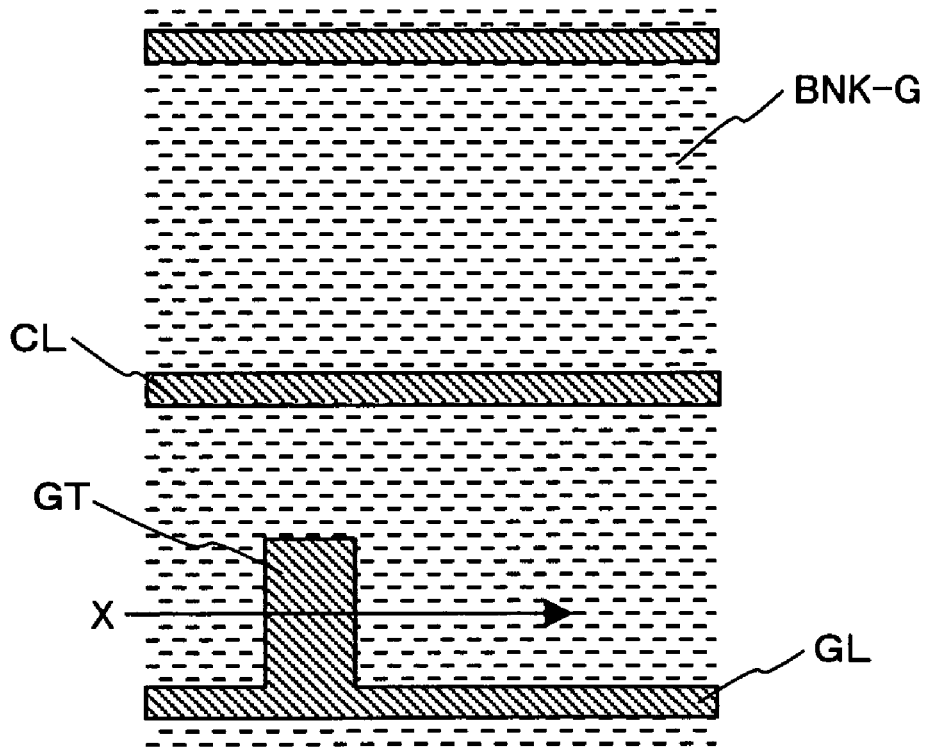
(b)
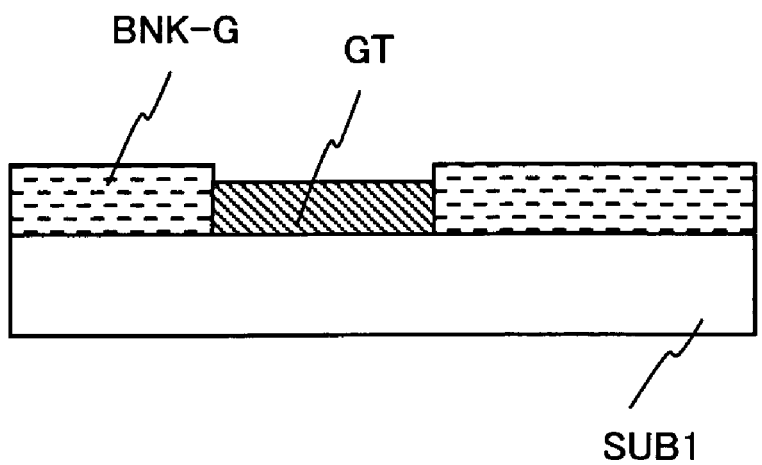

FIG. 9
(a)
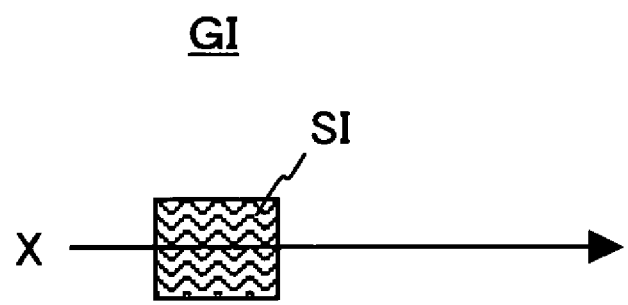
(b)
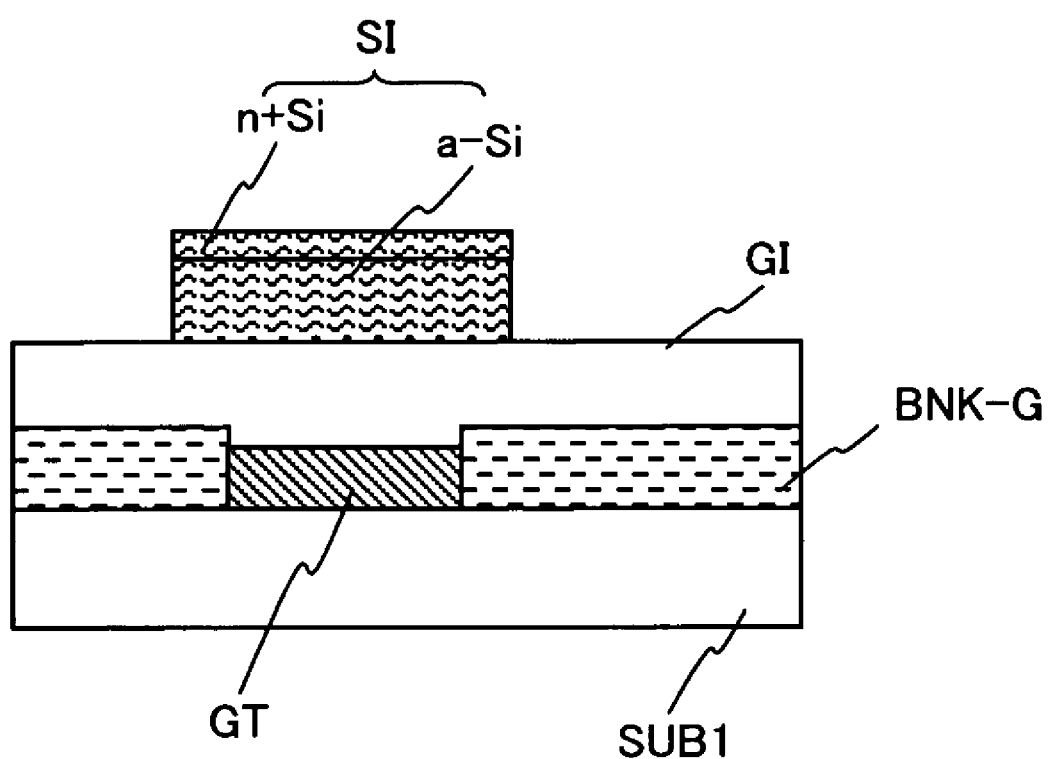

FIG. 10
(a)
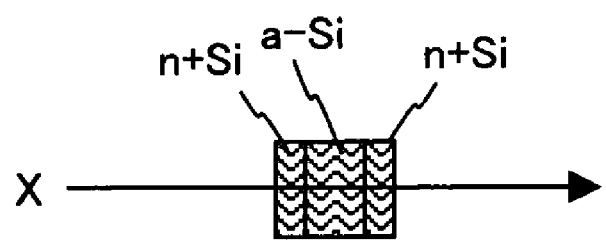
(b)
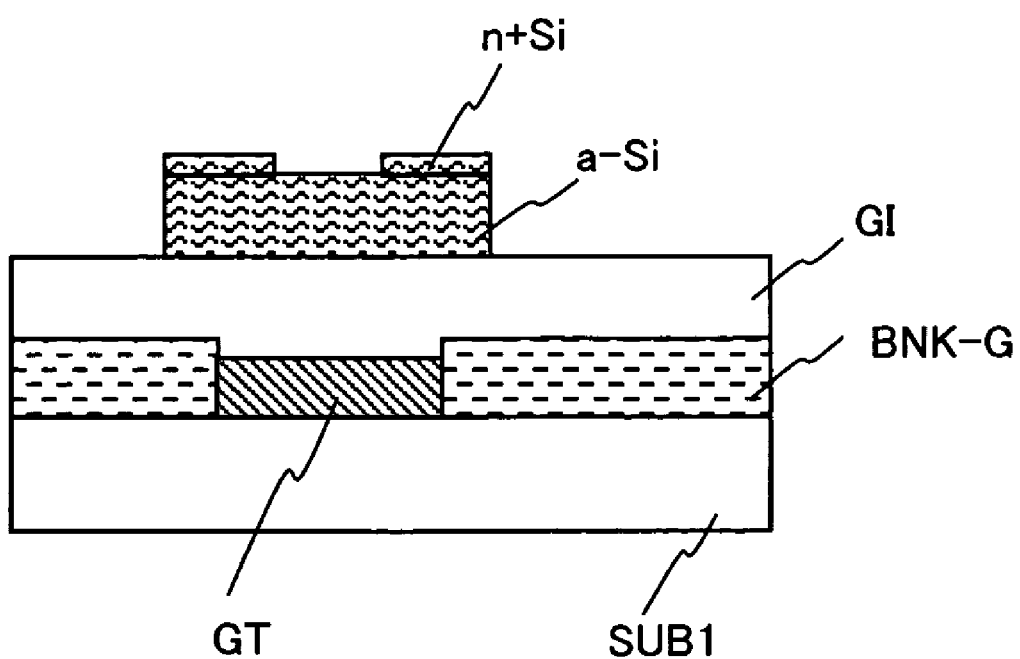

FIG. 11
(a)
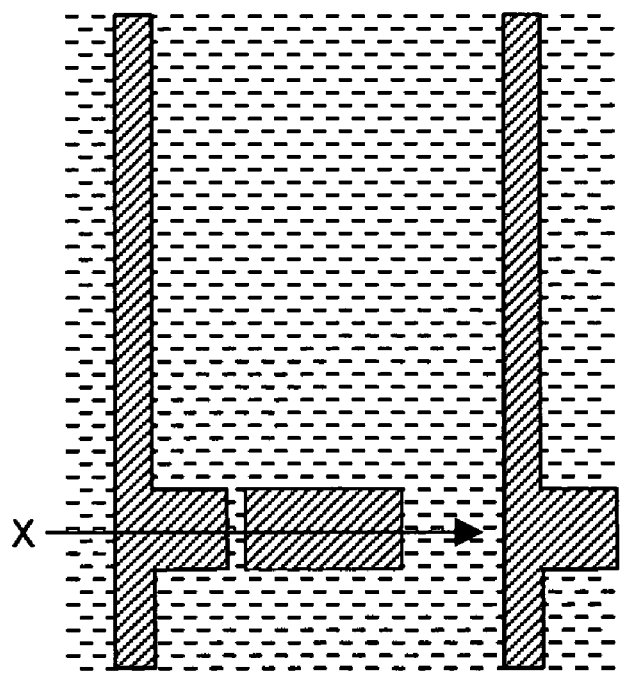
(b)
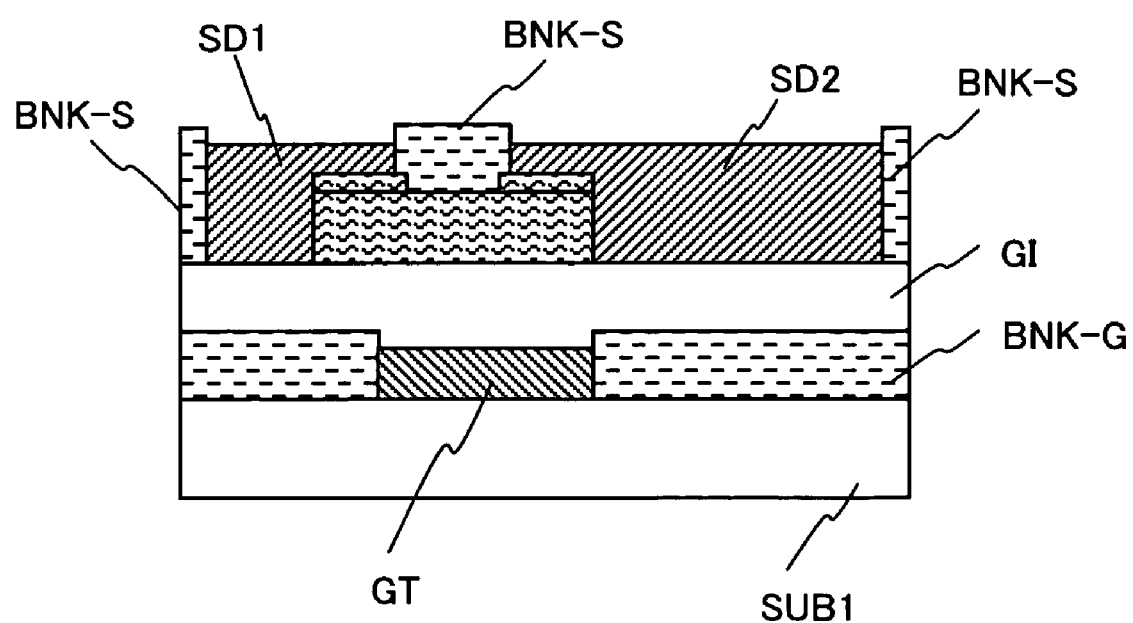

FIG. 12
(a)
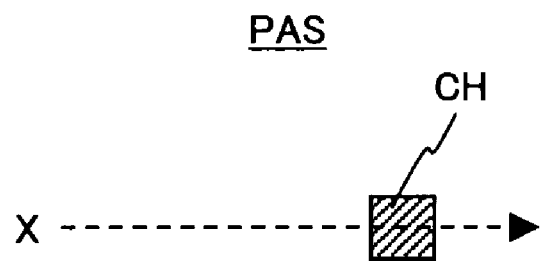
(b)
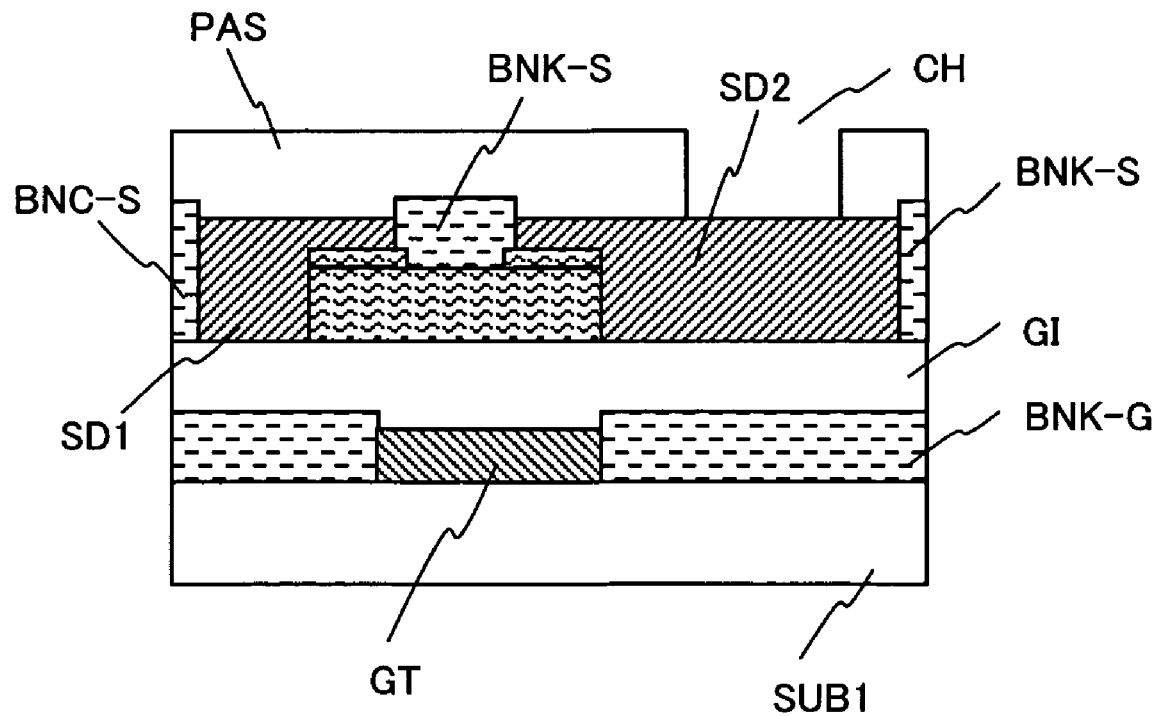

FIG. 13
(a)
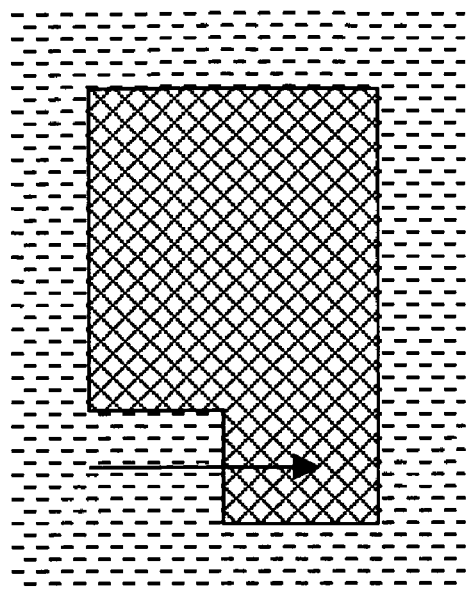
(b)
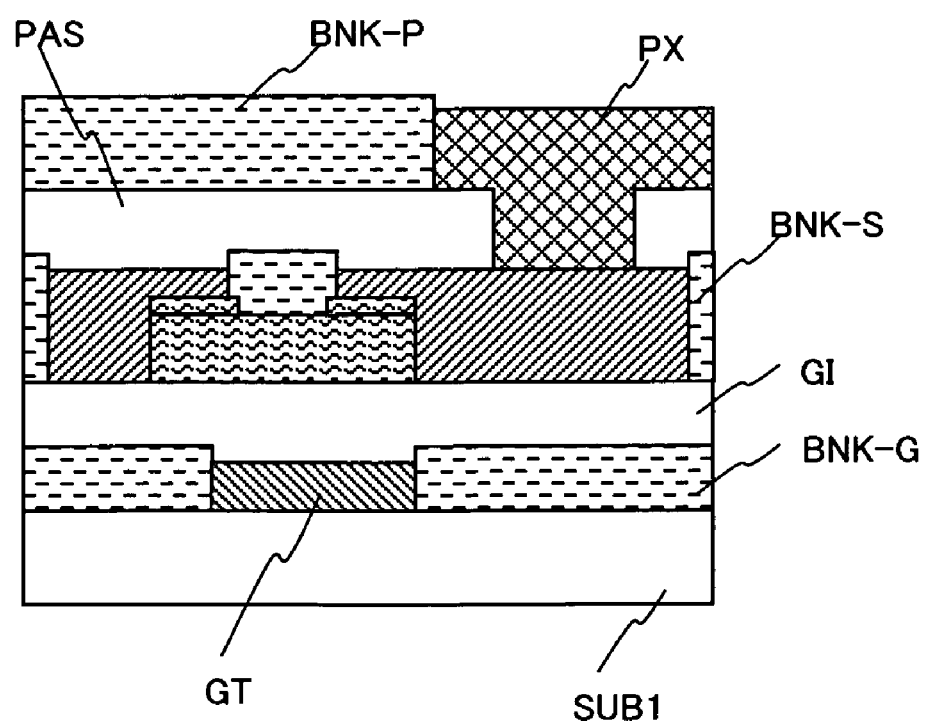

FIG. 15

| Pixel | PX (ITO) Film thickness | Number of droppings |
|---|---|---|
| B | 120 nm | 12 droppings |
| G | 130 nm | 13 droppings |
| R | 160 nm | 16 droppings |

Correlation between CIE 1931 xy chromaticity coordinates and color

DISPLAY DEVICE FOR REDUCING CHROMATICITY DIFFERENCE IN WHITE COLOR AND METHOD FOR MANUFACTURING THE SAME

BACKGROUND OF THE INVENTION

1. Field of the Invention

The present invention relates to a display device. In particular, the invention relates to a display device with color reproducibility of high fidelity by reducing chromaticity difference in white color display caused by difference in optical property for each pixel.

2. Description of the Prior Art

In an active type flat panel type display device for performing on-off control for each pixel, a display panel is combined with the surrounding circuits and with the structural members as required. It is generally practiced that the display panel is provided by arranging a switching element represented by a thin-film transistor (TFT) and a multiple of pixels with pixel electrodes driven by TFT arranged in rows and columns in matrix form on an insulating substrate.

A plurality of gate lines to supply scan signals to select a multiple of TFTs arranged in matrix form for each row and a plurality of data lines to supply display data to TFT connected to the selected gate lines are arranged in crossover arrangement in matrix form to match the rows and columns. These lines are the so-called thin-film lines. Each pixel is arranged at an intersection of the thin-film lines (gate lines and data lines). In addition to the gate lines and data lines, some of the display devices have thin-film lines necessary to match the display method of the display device. The following description can also be applied to such type of thin-film lines.

A typical example of this type of display provided with pixel electrode for each pixel is a liquid crystal display device. In addition, an organic EL display device is also known. Description will be given below by taking an example on the liquid crystal display device. FIG. 17 is a schematical cross-sectional view of a panel to explain a conventional type liquid crystal display device. This can also be applied to the organic EL display device in a view-point of transparent electrodes being used.

The liquid crystal display device is provided by placing a liquid crystal LC between a first substrate SUB1 and a second substrate SUB2, each made of an insulating plate, for which glass is used as a suitable material. On inner surface of the first substrate SUB1, data signal line, scan signal line, thin-film transistor TFT, etc. are formed (not shown). The pixel electrodes PXR, PXG, and PXB of three colors (red, green, and blue) under on-off control by thin-film transistor are provided, and on an upper layer of these, a first orientation film ORI1 is formed. The first substrate SUB1 is also called a thin-film transistor substrate (TFT substrate).

On the other hand, on inner surface of the second substrate SUB2, color filters RF, GF, and BF of three colors (red, green, and blue) are formed to match the pixel electrodes PXR, PXG, and PXB of the first substrate SUB1 respectively. A counter electrode (common electrode) AT is formed by all over deposition to cover the color filters RF, GF, and BF, and a second orientation film ORI2 is formed on it. This second substrate SUB2 is also called a color filter substrate (CF substrate).

The pixel electrodes PXR, PXG, and PXB and the counter electrode (common electrode) AT are made of transparent conductive films, for which ITO is used as a suitable material. Refractive index and film thickness of each of the pixel electrodes PXR, PXG, and PXB and the counter electrode AT are the same regardless of the pixel. For instance, in case of ITO, when refractive index is 2.0 and film thickness is 130 nm, transmissivity is 94.98%. To standard white color on CIE 1931 xy chromaticity coordinates, chromaticity difference is 0.00441. FIG. 18 shows CIE 1931 xy chromaticity coordinates.

The chromaticity difference as described above is defined as "a distance on coordinates to standard color of CIE 1931 xy chromaticity coordinates". Standard white color indicates chromaticity coordinates $(x_w, y_w)=(0.333, 0.333)$ obtained from spectrum, which has 100% transmissivity in all-wavelength range. Chromaticity difference of a certain point (xy) on FIG. 18 is expressed by the distance $\Delta L$ from the coordinates $(x_w, y_w)$. That is, $\Delta L=\{(x-x_w)^2+(y-y_w)^2\}^{1/2}$.

As a general theory on chromaticity difference, the following facts are known. Specifically, when chromaticity difference is 0.004 or more, color difference is recognizable. However, the recognition of the color difference is dull in the direction of blue (B) (color difference is difficult to recognize even when chromaticity difference exceeds 0.004), and recognition is sharp in the direction of yellow (Y) (color difference is easily recognized even when chromaticity difference is less than 0.004).

The Patent Document 1 discloses a liquid crystal display device, in which poor brightness uniformity in display caused by the difference of interference spectrum at peak wavelength of the light source is suppressed by controlling refractive index and film thickness of transparent electrode, which constitutes the pixels.

[Patent Document 1] JP-A-4-166915

SUMMARY OF THE INVENTION

In a conventional type display device, refractive index and film thickness of the transparent electrodes to make up pixel electrodes and the counter electrode are the same for pixels of 3 colors (red, green, and blue). Because the transmissivity of transparent electrodes of the pixels of 3 colors (red, green, and blue) differs from each other, chromaticity difference occurs in the light of each color, which has passed through the transparent electrode, and deviation occurs in white color coordinates (coloring occurs).

It is an object of the present invention to provide a display device and a method for manufacturing the same, by which it is possible to reduce chromaticity difference caused by the difference of transmissivity among the pixels of 3 colors when a light passes through a transparent conductive film (transparent electrode) to constitute the pixels and to display an image, which has color reproducibility in high fidelity.

To attain the above object, according to the present invention, optical film thickness of transparent conductive film to constitute the pixels is varied for each color filter of pixel. The optical film thickness is expressed by a product "nd" (refractive index "n"×film thickness "d").

The transparent conductive film is prepared as follows: An ink is prepared, in which fine particles of transparent conductive film material, e.g. indium tin oxide (ITO), indium zinc oxide (IZO), indium tin/zinc oxide (ITZO), etc. are dispersed in a binder. Then, the ink is coated (the term "drop" is used in case of ink jet) via nozzle of an ink jet device. Then, it is baked. The desired film thickness is controlled by the coating amount of the ink (the number of droppings). The refractive index is controlled by volume ratio of the fine particles of conductive material to the binder contained in the transparent conductive film in consideration of those refractive indices.

When a light passes through each of a plurality of transparent conductive films (transparent electrodes) of a plurality of pixels to constitute color pixels, chromaticity difference develops due to the difference in transmissivity of 3-color pixels, which is caused by the difference of film thickness and refractive index of the transparent conductive materials. This chromaticity difference can be decreased and an image display with color reproducibility in high fidelity can be obtained.

BRIEF DESCRIPTION OF THE DRAWINGS

FIG. 8 represents drawings each showing an essential structure in the manufacturing process of the liquid crystal display device of the present invention;

FIG. 9 represents drawings each showing an essential structure in the manufacturing process of the liquid crystal display device of the present invention;

FIG. 10 represents drawings each showing an essential structure in the manufacturing process of the liquid crystal display device of the present invention;

FIG. 11 represents drawings each showing an essential structure in the manufacturing process of the liquid crystal display device of the present invention;

FIG. 12 represents drawings each showing an essential structure in the manufacturing process of the liquid crystal display device of the present invention;

FIG. 13 represents drawings each showing an essential structure in the manufacturing process of the liquid crystal display device of the present invention;

FIG. 15 is a table to explain an example of film thickness of the pixel electrode after baking and the number of droppings in ink dropping for pixel electrode;

BEST MODE FOR CARRYING OUT THE INVENTION

Detailed description will be given on embodiments of the present invention referring to the attached drawings.

Embodiment 1

Figure 1:
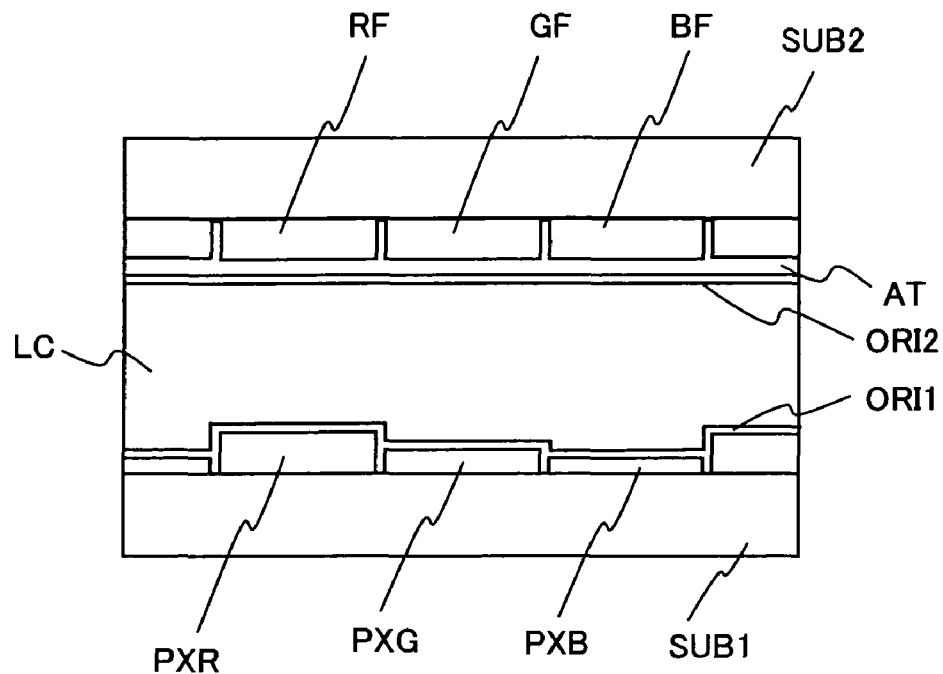
FIG. 1 is a schematical cross-sectional view of a liquid crystal panel to explain Example 1 of a substrate for display device according to the present invention.

FIG. 1 is a schematical cross-sectional view of a liquid crystal panel to explain Embodiment 1 of a substrate for display device according to the present invention. Although not shown in the figure, in this liquid crystal panel, pixel on-off control circuits such as wiring, thin-film transistor, etc. are formed on the main surface (inner surface) of a first substrate SUB1, for which glass is used as a suitable material. Three color pixels to constitute color pixel comprise pixel electrodes PXR, PXG, and PXB of a first transparent conductive film on a main surface of the first substrate SUB1. These pixel electrodes are made of ITO. A first orientation film ORI1 is formed to cover the pixel electrodes PXR, PXG, and PXB.

On the other hand, on a main surface of a second substrate SUB2, for which glass is used as a suitable material, color filters RF, GF, and BF to constitute the pixels are formed to face each of the pixel electrodes PXR, PXG, and PXB respectively. A common electrode (counter electrode) AT, which is a second transparent conductive film, is formed to cover the color filters RF, GF, and BF. The common electrode AT is also made of ITO. On the common electrode AT, a second orientation film ORI2 is formed.

Between the first orientation film ORI1 and the second orientation film ORI2, a liquid crystal layer LC is arranged by sealing, and a liquid crystal panel is made up.

In Embodiment 1, film thickness and refractive index of 3-color pixel electrodes PXR, PXG, and PXB are designed to be different from each other. More concretely, film thickness of the pixel electrode PXR of red pixel is 160 nm, and refractive index is 1.9. The film thickness of the pixel electrode PXG of green pixel is 130 nm, and refractive index is 2.1. The film thickness of pixel electrode PXB of blue pixel is 120 nm, and refractive index is 1.9. Film thickness and refractive index of the common electrode AT are the same for the three pixels.

In the arrangement of Embodiment 1, transmissivity is 95.39%, and chromaticity difference is 0.00225. This chromaticity difference is considerably lower than 0.004. There is almost no displacement in coordinates of white color, and coloring in white display is not recognizable. Incidentally, in case it is so arranged in Embodiment 1 that the pixel electrodes have the same film thickness for 3-color pixels and chromaticity difference is the same as in the conventional structure explained in connection with FIG. 17, transmissivity is 93.61%. Compared with this, transmissivity of Example 1 is improved by 1.78%.

Embodiment 2

In Embodiment 2, in the structure shown in FIG. 1, the refractive index of 3-color pixel electrodes PXR, PXG, and PXB are the same, i.e. 2.0. Film thickness of the pixel electrode PXR of red pixel is set to 150 nm. Film thickness of the pixel electrode PXG of green pixel is set to 140 nm, and film thickness of the pixel electrode PXB of blue pixel is set to 120 nm.

In the arrangement of Embodiment 2, transmissivity is 95.34% and chromaticity difference is 0.00257. This chromaticity difference is also considerably lower than 0.004. There is almost no displacement in the coordinates of white color, and coloring in white display is not recognizable. Incidentally, in case it is so arranged in Embodiment 2 that the pixel electrodes in 3-color pixels have the same film thickness and chromaticity is the same as in the conventional structure as explained in connection with FIG. 17, transmissivity is 93.82%. Compared with this, the transmissivity in Embodiment 2 is improved by 1.52%.

Embodiment 3

Figure 17:
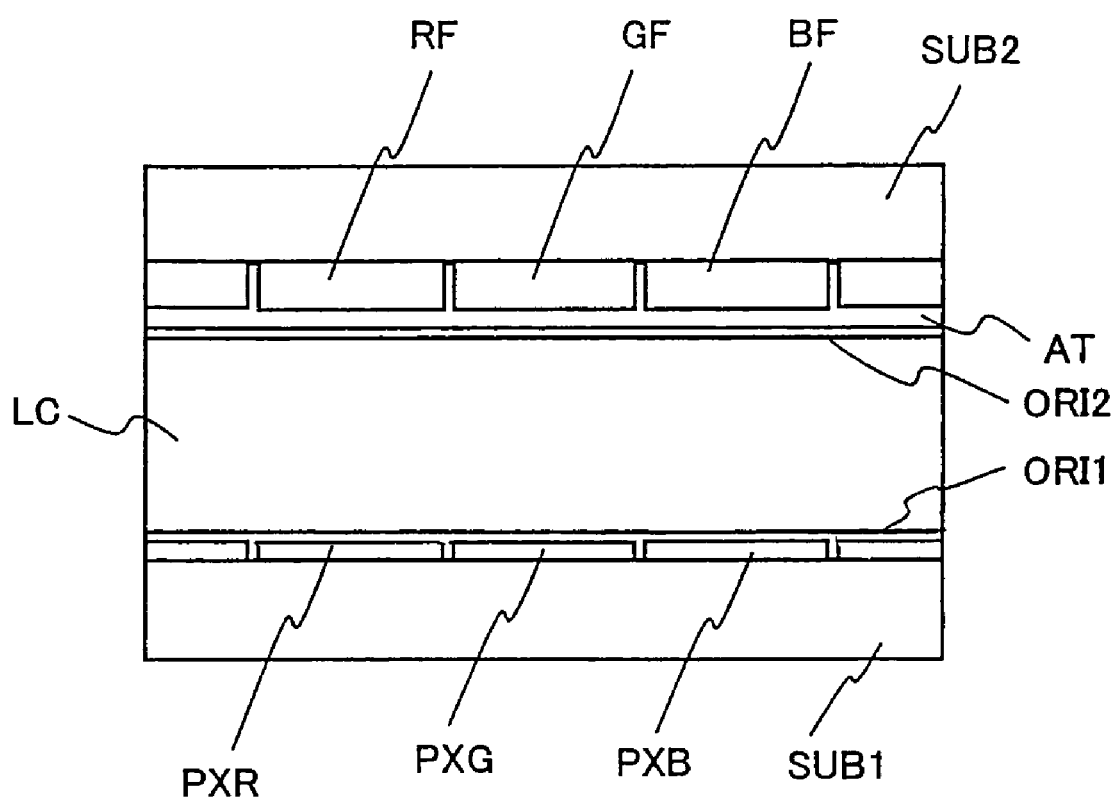
FIG. 17 is a cross-sectional view of a panel to explain a conventional type liquid crystal display device.
Figure 18:
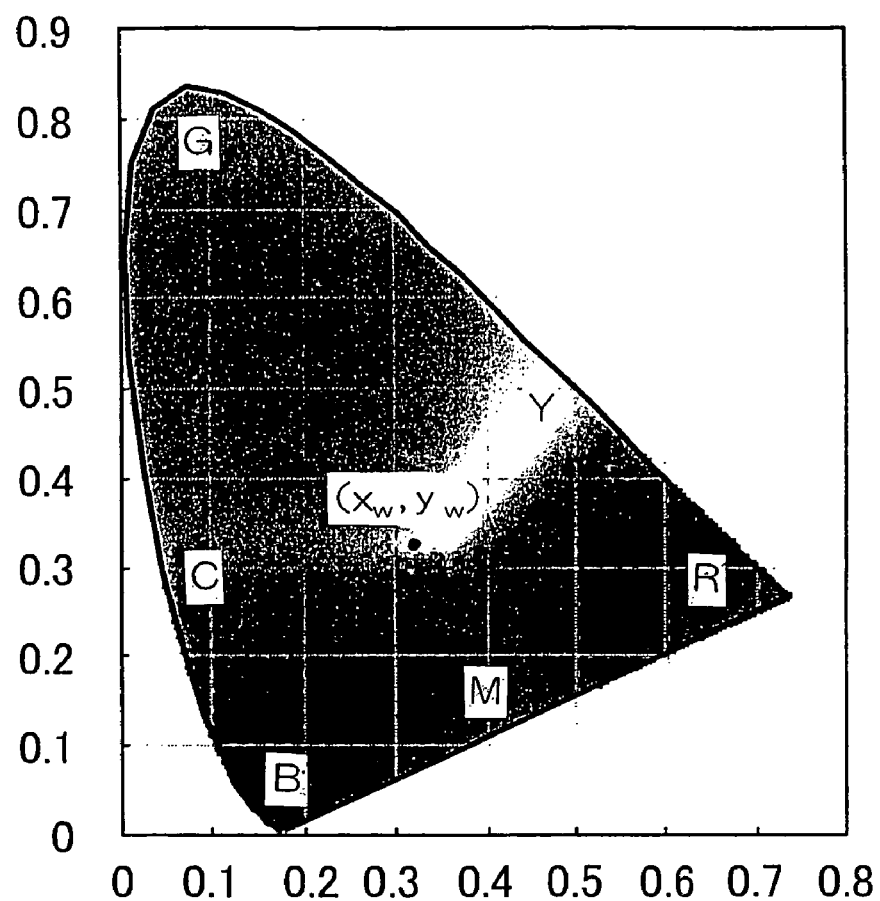
FIG. 18 is a diagram of CIE 1931 xy chromaticity coordinate system.

In Embodiment 3, film thickness of each of the 3-color pixel electrodes PXR, PXG, and PXB is set to the same as in the conventional example shown in FIG. 17, and refractive index is made different from the conventional example. More concretely, film thickness of the pixel electrode of each pixel is set to 130 nm, and refractive index of pixel electrode PXR of red pixel is set to 2.2. Refractive index of pixel electrode PXG of green pixel is set to 1.9, and refractive index of pixel electrode PXB of blue pixel is set to 1.8. In the common electrode AT, film thickness and refractive index are the same for all of 3 color pixels.

In the arrangement of Embodiment 3, transmissivity is 95.38%, and chromaticity difference is 0.00298. This chromaticity difference is also considerably lower than 0.004. There is almost no displacement in the coordinates of white color, and coloring in white display is not recognizable. Incidentally, in case it is so arranged in Embodiment 3 that chromaticity difference is the same as in the conventional structure shown in FIG. 17, transmissivity is 94.08%. Compared with this, transmissivity in Embodiment 3 is improved by 1.30%.

Embodiment 4

In Embodiment 4, in the structure of Embodiment 1 shown in FIG. 1, refractive index of each of 3-color pixel electrodes PXR, PXG, and PXB is set to the same value of 1.8. Film thickness of the pixel electrode PXR of red pixel is set to 170 nm. Film thickness of the pixel electrode PXG of green pixel is set to 150 nm, and film thickness of the pixel electrode PXB of blue pixel is set to 130 nm.

In the arrangement of Embodiment 4, transmissivity is 95.35%, and chromaticity difference is 0.00235. This chromaticity difference is also considerably lower than 0.004. There is almost no displacement in the coordinates of white color, and coloring in white display is not recognizable. Incidentally, in case it is so arranged in Embodiment 4 that the thickness is the same in each of the pixel electrodes of 3-color pixels and chromaticity difference is the same as in the conventional structure shown in FIG. 17, transmissivity is 93.68%. Compared with this, transmissivity in Embodiment 4 is improved by 1.67%.

Embodiment 5

Figure 2:
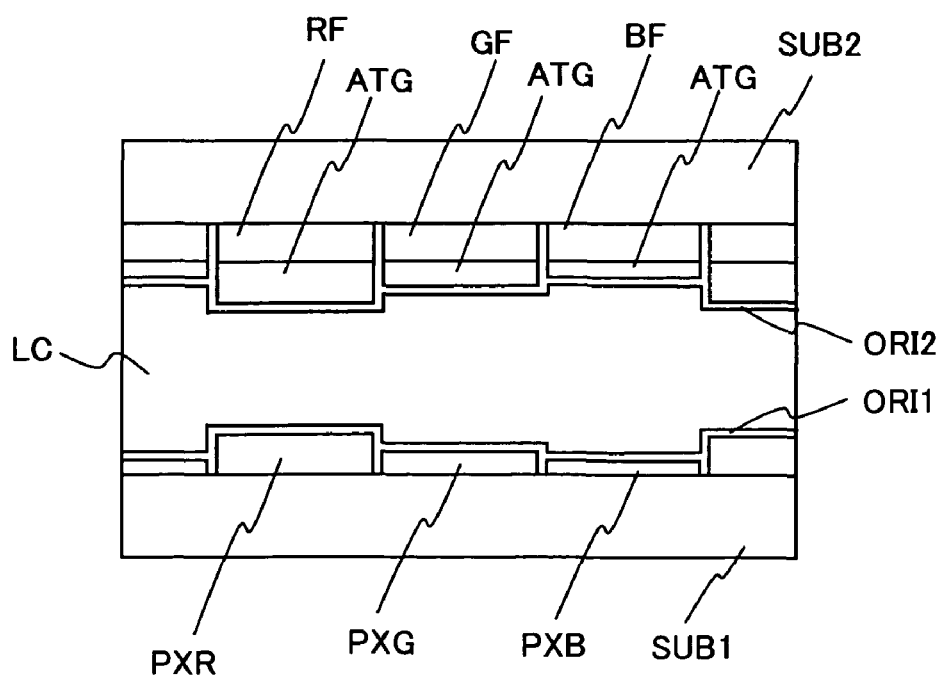
FIG. 2 is a schematical cross-sectional view of a liquid crystal panel to explain Example 5 of a substrate for display device according to the present invention.

FIG. 2 is a schematical cross-sectional view of a liquid crystal panel to explain Embodiment 5 of the substrate for the display device of the present invention. Although not shown in the figure, in this liquid crystal panel, pixel on-off control circuits such as wiring, thin-film transistor, etc. are formed on a main surface (inner surface) of a first substrate SUB1, for which glass is used as a suitable material. Three color pixels to constitute color pixels comprise pixel electrodes PXR, PXG, and PXB, i.e. a first transparent conductive film on the main surface of the first substrate SUB1. These pixel electrodes are made of ITO. A first orientation film ORI1 is formed to cover the pixel electrodes PXR, PXG, and PXB.

On the other hand, on the main surface of a second substrate SUB2, for which glass is used as a suitable material, color filters RF, GF and BF to constitute each pixel respectively are formed to face to the pixel electrodes PXR, PXG, and PXB. A common electrode (counter electrode) AT, which is a second transparent conductive film, is formed in island-like shape to cover the color filters RF, GF, and BF. This common electrode AT is also made of ITO. Common electrodes ATR, ATG, and ATB in island-like shape of red, green and blue correspond to the pixel electrodes of PXR, PXG, and PXB respectively. These common electrodes ATR, ATG, and ATB are electrically connected to adequate portions of the display panel. A second orientation film ORI2 is formed to cover the common electrodes ATR, ATG, and ATB.

Between the first orientation film ORI1 and the second orientation film ORI2, a liquid crystal layer LC is formed by sealing, and a liquid crystal display device is made up.

In Embodiment 5, film thickness of 3-color pixel electrodes PXR, PXG, and PXB and film thickness of the common electrodes ATR, ATG and ATB are varied for each color. In FIG. 2, film thickness of the pixel electrodes PXR, PXG, and PXB and film thickness of the common electrodes ATR, ATG, and ATB are shown by similar thickness difference for each color. However, the invention is not limited to this, and it will suffice if total film thickness (i.e. film thickness of pixel electrode+film thickness of common electrode) of the electrode for each color is made different. Here, it is so arranged that total electrode film thickness for red pixel is 170 nm, and total electrode film thickness for green pixel is 150 nm, and total electrode film thickness for blue pixel is 130 nm. Refractive index of 3-color pixel electrodes PXR, PXG, and PXB and the common electrodes ATR, ATG, and ATB are set to the same value of 1.8.

In the arrangement of Embodiment 5, transmissivity is 95.73%, and chromaticity difference is 0.00036. This chromaticity difference is lower than 0.004. There is almost no displacement in the coordinates of white color, and coloring in white display is not recognizable. Incidentally, it is not possible to arrange in Embodiment 5 in such manner that the pixel electrodes have the same film thickness for 3-color pixels, and that chromaticity difference is the same as in the conventional structure shown in FIG. 17. When chromaticity difference is at the minimum (0.00069), transmissivity is 92.36%. Compared with this, transmissivity in Embodiment 5 is improved by 3.37%.

Normally, refractive index "n" of ITO has such wavelength dispersion that it is gradually decreased with the increase of wavelength in the visible light range. In the Embodiments given above, in order to facilitate the explanation, calculation was made under the assumption that there is no such wavelength dispersion. However, as for the visible light the explanations of the above Embodiments are correct from general viewpoint.

Figure 3:
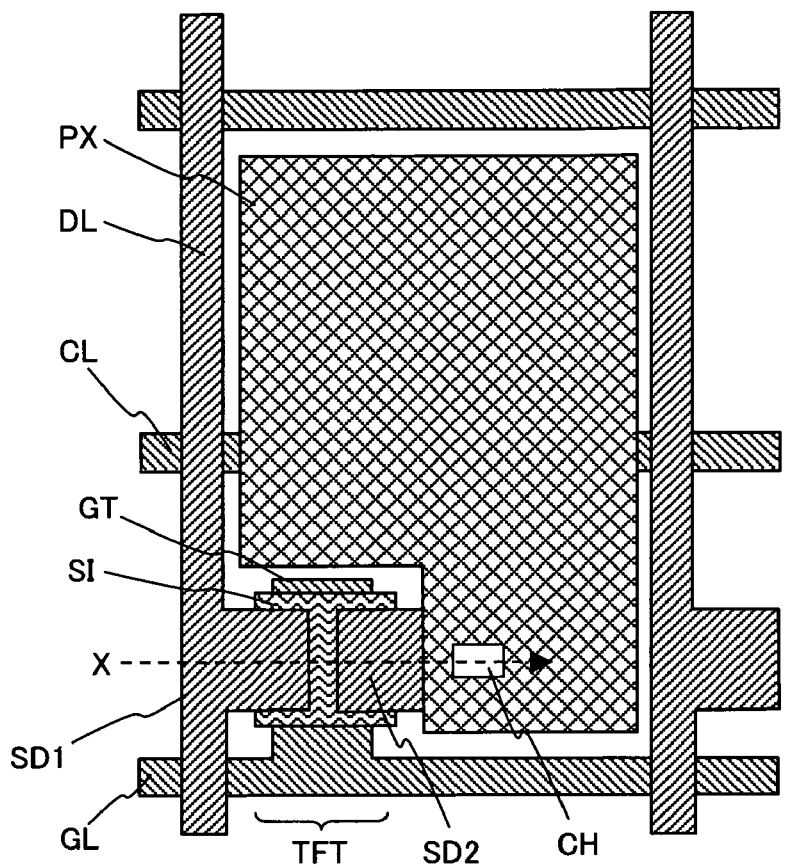
FIG. 3 is a schematical plan view to explain an arrangement example of one pixel in a first substrate in a liquid crystal display device, to which a manufacturing method of the present invention is applied.
Figure 4:
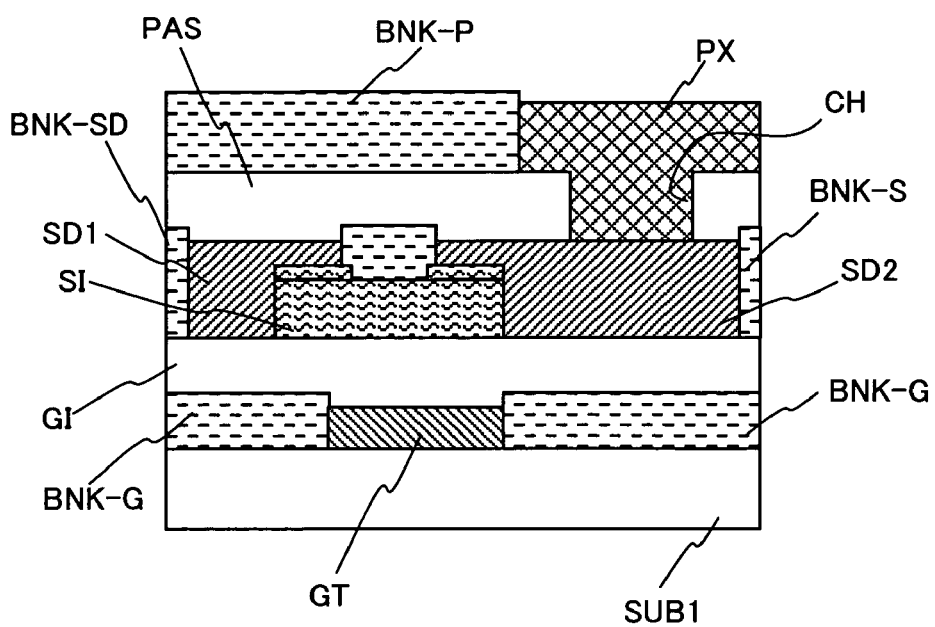
FIG. 4 is a schematical cross-sectional view along the arrow X in FIG. 3.

Next, description will be given on the method for manufacturing the display device according to the present invention. FIG. 3 is a schematical plan view to explain an arrangement example of one pixel of the first substrate in a liquid crystal display device, to which the manufacturing method of the present invention is applied. FIG. 4 is a schematical cross-sectional view along the arrow X in FIG. 3. In FIG. 3, one pixel is formed in a region (pixel region) enclosed by two scan lines (gate lines) GL and two image signal lines (data lines) DL.

A thin-film transistor TFT for performing on-off control of pixels is arranged at a corner of the pixel region. The thin-film transistor TFT comprises a gate electrode GT extending from the gate line GL, a silicon semiconductor layer SI, a source electrode SD1 extending from the data line DL, and a drain electrode SD2. The source electrode SD1 and the drain electrode SD2 change places with each other during display operation. Here, to avoid confusion, explanation is given on the fixed condition as described above.

The drain electrode SD2 is connected to the pixel electrode PX via a contact hole CH. In this arrangement, a capacity line CL to provide storage capacity of liquid crystal is formed across the pixel region.

In the liquid crystal display device of the present invention, a part or all of the lines and electrodes are manufactured by coat printing method (ink jet method) using an ink jet device. Now, description will be given on general outline of the manufacturing process according to FIG. 4. First, a gate bank BNK-G having pattern groove for gate lines and gate electrode are formed on the main surface of the first substrate SUB 1, and the gate line GL and the gate electrode GT are formed by ink jet method. Then, a gate insulator film GI is placed to cover them.

A silicon semiconductor film is coated, and a silicon semiconductor layer SI, i.e. an active layer of the thin-film transistor, is formed by patterning. In this case, an n+ layer is provided on upper layer of the silicon semiconductor layer, and a portion to be a channel of the thin-film transistor is removed. A source-drain bank (hereinafter referred as "source bank") BNK-SD is formed in the pattern groove of the source electrode and the drain electrode, and the source electrode SD1 and the drain electrode SD2 are formed by ink jet method.

Then, a protective film PAS is formed. On this protective film PAS, a contact hole CH to reach the drain electrode SD2 is formed on the protective film PAS. A pixel bank BNK-P with an opening in the region of the pixel electrode is provided, and the pixel electrode PX is formed by ink jet method. Finally, a first orientation film (not shown) is coated, and the manufacture of the first substrate is completed. Each of the banks as given above is formed by photolithographic process using photosensitive resist, and a resin material is used, which maintains transparency even after the completion of the process.

Figure 6:
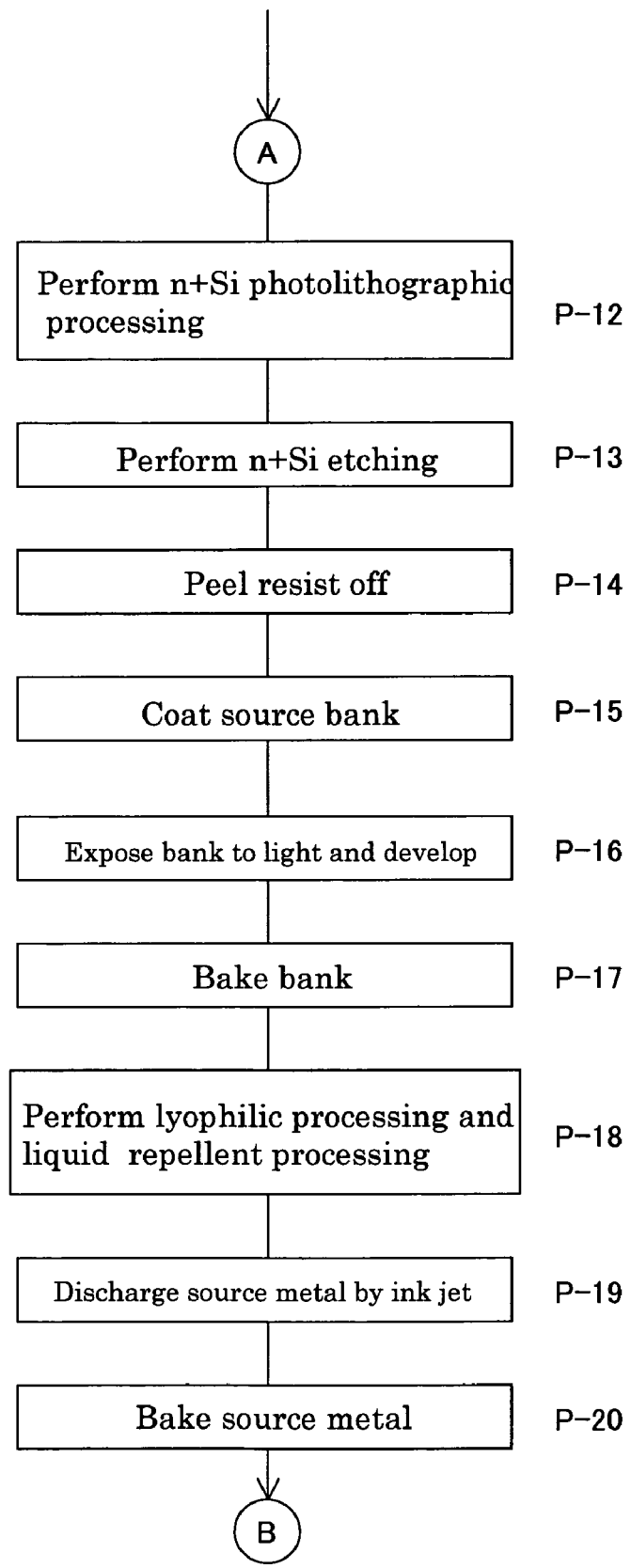
FIG. 6 is a flow chart subsequent to FIG. 5 to explain the manufacturing process of the liquid crystal display device of the present invention.
Figure 7:
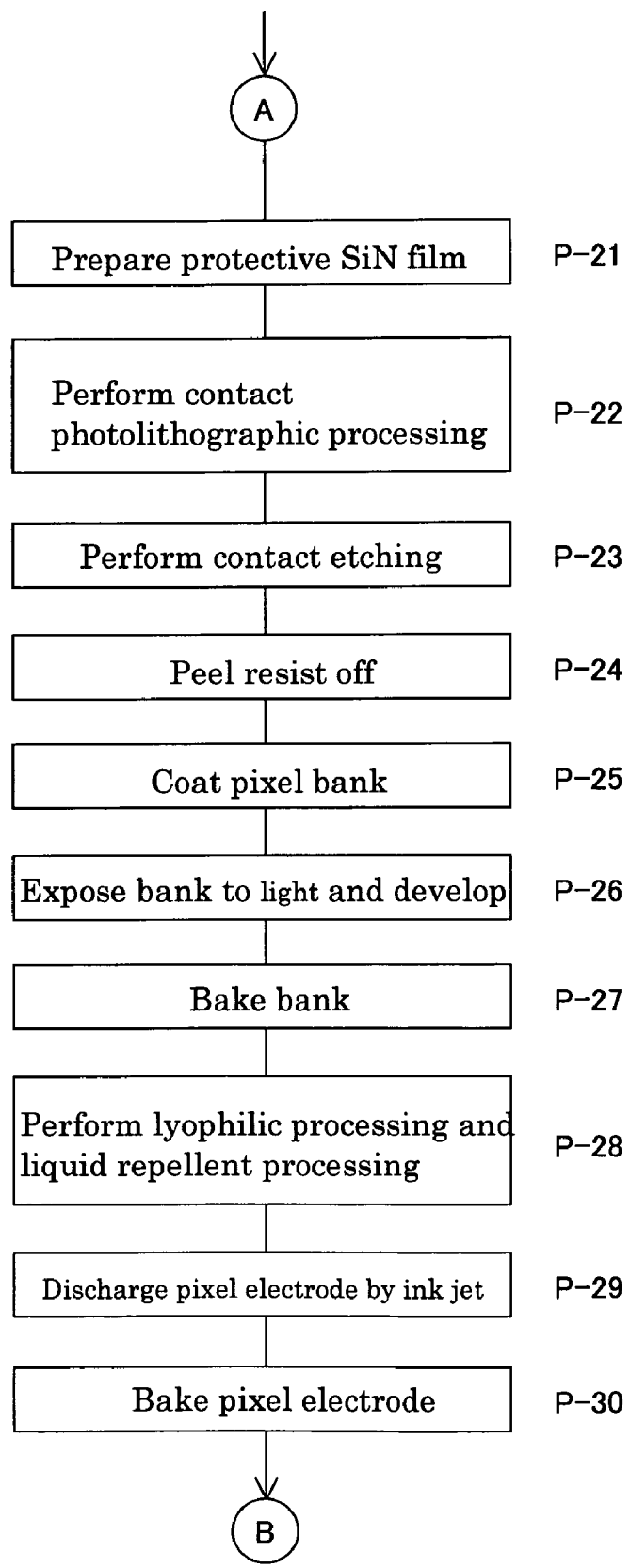
FIG. 7 is a flow chart subsequent to FIG. 6 to explain the manufacturing process of the liquid crystal display device of the present invention.

Next, description will be given on a manufacturing process of the liquid crystal display device as described above by referring to the flow charts of FIG. 5 to FIG. 7 and to the drawings of structures of essential portions of FIG. 8 to FIG. 13. FIG. 8(*a*) is a plan view of pixel portion showing the status of completion of the process (P-7) of FIG. 5, and FIG. 8(*b*) is a cross-sectional view along the arrow X in FIG. 8(*a*). FIG. 9(*a*) is a plan view of the pixel portion showing the status of completion of the process (P-11) in FIG. 5, and FIG. 9(*b*) is a cross-sectional view along the arrow X in FIG. 9(*a*). FIG. 10(*a*) is a plan of the pixel portion showing the status of completion of the process (P-14) in FIG. 6, and FIG. 10(*b*) is a cross-sectional view along the arrow X in FIG. 10(*a*). FIG. 11(*a*) is a plan view of the pixel portion showing the status of completion of the process (P-20) in FIG. 6, and FIG. 11(*b*) is a cross-sectional view along the arrow X in FIG. 11(*a*). FIG. 12(*a*) is a plan view of the pixel portion showing the status of completion of the process (P-24) in FIG. 7, and FIG. 12(*b*) is a cross-sectional view along the arrow X in FIG. 12(*a*). FIG. 13(*a*) is a plan view of the pixel portion showing the status of completion of the process (P-30) in FIG. 7, and FIG. 13(*b*) is a cross-sectional view along the arrow X in FIG. 13 (*a*).

Figure 5:
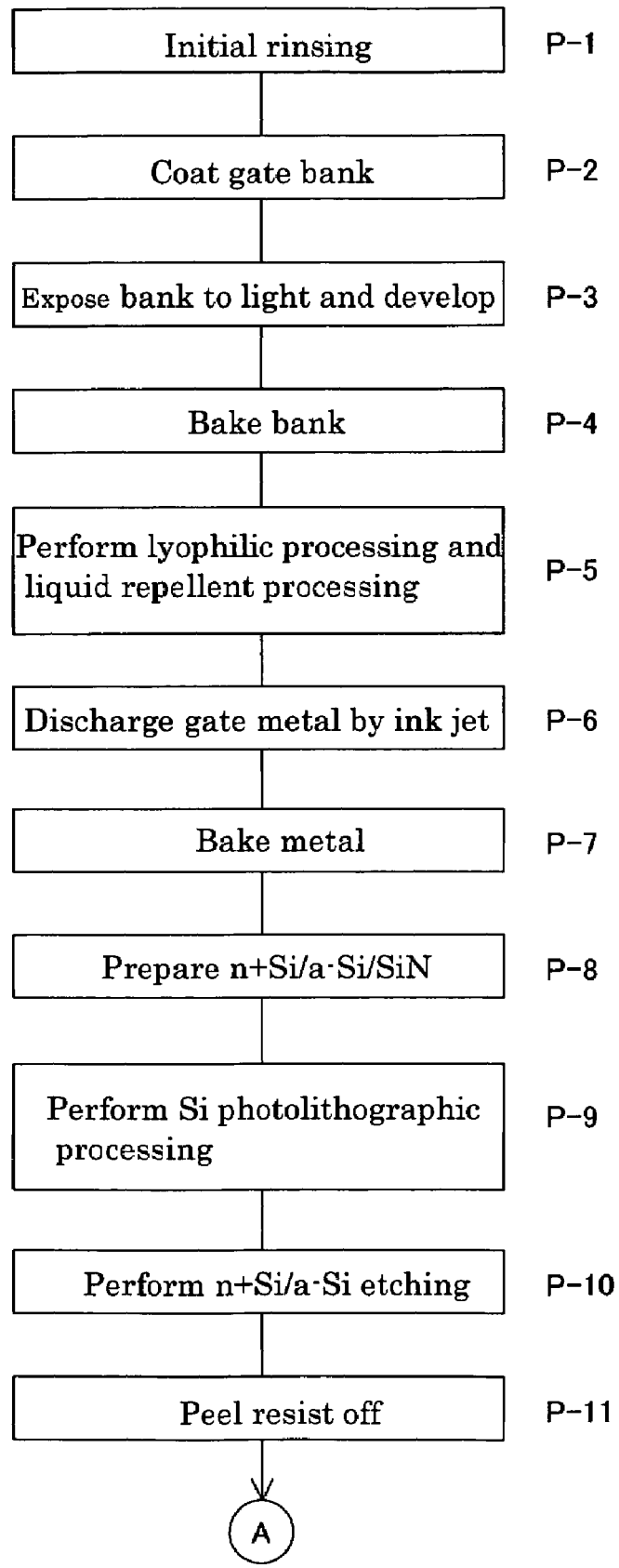
FIG. 5 is a flow chart to explain a process for manufacturing the liquid crystal display device according to the present invention.

In FIG. 5, the glass substrate, which has been carried in, is rinsed by initial rinsing (P-1), and a photosensitive resist for the gate bank BNK-G is coated (P-2). Light exposure is performed via a photolithography mask with a pattern to match the gate line and the gate electrode (and capacity line), and the image is developed. Then, the photosensitive resist in the groove of the pattern of the gate line and gate electrode (and capacity line) is removed (P-3). The remaining photosensitive resist is baked away, and the gate bank BNK-G is prepared (P-4).

Lyophilic processing is performed on the groove of the gate bank BNK-G, and liquid repellent processing is performed on the other portion (P-5). A gate metal (an ink, in which metal particles for gate lines and gate electrodes are dispersed in a binder) is discharged (dropped) from an ink jet nozzle into the groove and is coated (P-6). This is then baked, and the gate line GL and the gate electrode (GT) (and capacity line CT) are prepared (P-7). FIG. 8 shows the structure of the pixel portion under this condition.

Next, silicon nitride is deposited by sputtering and the gate insulation layer GI is formed. A silicon semiconductor (e.g. a–Si and n+Si) film is coated on it (P-8). A photosensitive resist is coated, and a silicon semiconductor layer in island-like shape is formed on a portion, which is to be a thin-film transistor active layer, by patterning in photolithographic process (P-8). The semiconductor films a–Si and n+Si are processed by etching (P-10), and the photosensitive resist is removed (P-11). FIG. 9 shows the structure of the pixel portion under this condition.

The photosensitive resist is coated, and etching is performed so that a–Si to be a channel at the central portion of n+Si is exposed in photolithographic process (P-12) (P-13). Then, the photosensitive resist is removed (P-14). FIG. 10 shows the structure of the pixel portion under this condition.

A resist, which is to be the source bank BNK-SD, is coated (P-15). The portions, which are to be the source line, the source electrode, and the drain electrode, are exposed to light, developed and removed (P-16). After baking, the source bank BNK-SD is formed on the portions, which have grooves at the portions of the source line, the source electrode, and the drain electrode (P-17).

The groove of the source bank BNK-SD is processed by lyophilic processing, and liquid repellent processing is performed on the other portions (P-18). A source metal, i.e. a conductive ink, to become the source line, the source electrode and the drain electrode, is discharged by ink jet method into the grooves of the source bank BNK-SD and is coated (P-19). After baking this, the source electrode SD1, the drain electrode SD2, etc. are formed (P-20). FIG. 11 shows the structure of the pixel portion under this condition.

Next, silicon nitride is deposited on front surface of the substrate by means such as sputtering, and a protective film PAS is formed (P-21). The photosensitive resist is coated, and this is exposed to light via a photomask. After developing this, a contact hole CH reaching the drain electrode SD2 is formed on the protective film PAS (P-22) (P-23). FIG. 12 shows the condition where the remaining photosensitive resist is removed (P-24).

A resist for pixel bank is coated (P-25), and this is exposed to light and developed by photolithographic process (P-26). After baking (P-27), a pixel bank BNK-P with an opening in the region of the pixel electrode PX is formed. Lyophilic processing is performed on the opening of the region of the pixel electrode PX, and liquid repellent processing is performed on the other portions (P-28). To the opening in the region of the pixel electrode PX, an ink for pixel electrode (in which fine particles of transparent conductive material (preferably, ITO) is dispersed in a binder) is coated by ink jet method (P-29). After baking, the pixel electrode PX is formed (P-30). FIG. 13 shows the structure of the pixel portion under this condition.

Figure 14:
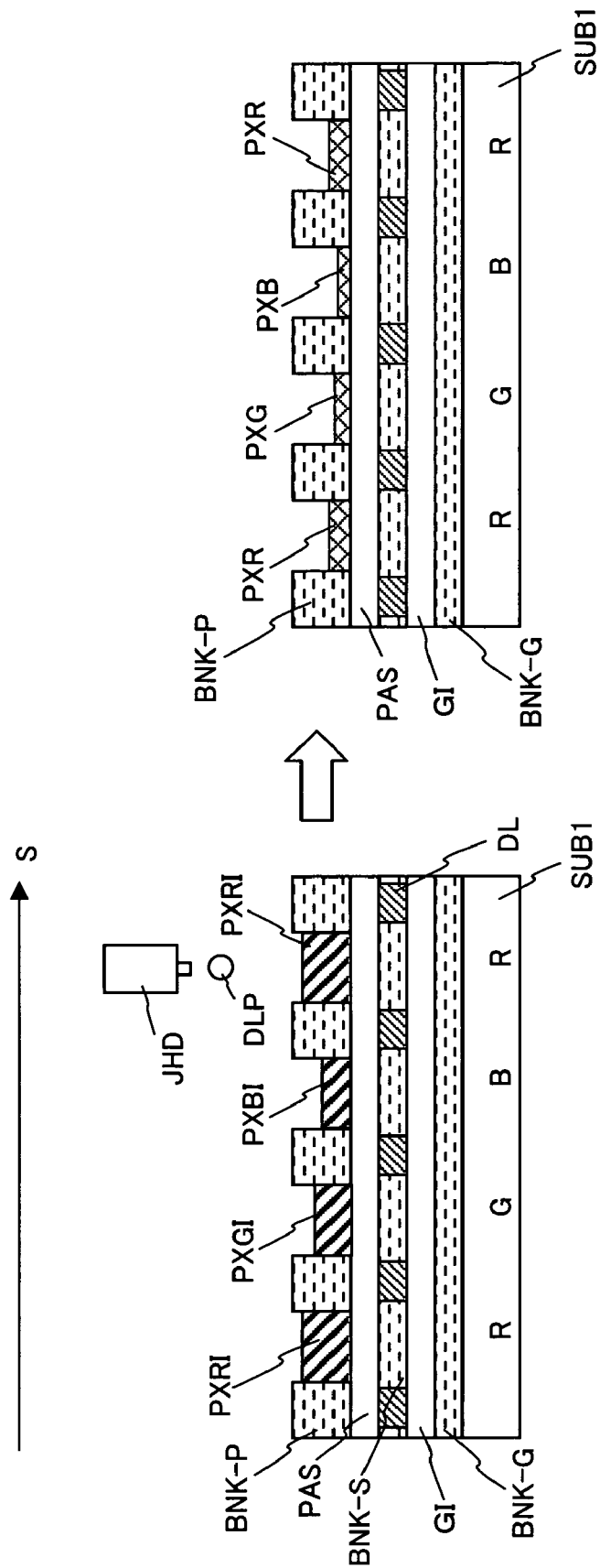
FIG. 14 is a schematical drawing to explain a method to vary the film thickness of pixel electrode for each color in the liquid crystal display device of the present invention.

FIG. 14 is a schematical drawing to explain a method to change the thickness of the pixel electrode for each color in the liquid crystal display device of the present invention. FIG. 14(*a*) shows a condition where the ink for pixel electrode is discharged and coated by ink jet method, and FIG. 14(*b*) shows an arrangement of the pixel electrode after the baking.

In FIG. 14(a), the gate bank BNK-G, the gate insulator film GI, the data line DL, the source bank BNK-SD, the protective film PAS, and the pixel bank BNK-P are formed on the main surface of the first substrate SUB1.

According to the present invention, as shown in FIG. 14 (a), ink drops DLP for pixel electrode are dropped and coated on the pixel region of each of red pixel R, green pixel G, and blue pixel B respectively while scanning a nozzle head of the ink jet device in the direction of S. The inks PXR1, PXG1, and PXB1 thus coated are partitioned and stored in the pixel bank BNK-P. By baking, pixel electrodes PXR, PXG, and PXB with different film thickness for each color are formed as shown in FIG. 14(b). The difference of the film thickness is controlled by the discharge amount (coating amount, i.e. the number of droppings) of the ink drops of each pixel so that the pixel electrode baked is to have the film thickness as required.

FIG. 15 is a table to explain an example of the film thickness of the pixel electrode after baking and the number of droppings of ink drops for pixel electrode. In this example, ITO dispersed in a binder is used as the ink for pixel electrode. When film thickness of each of the pixel electrodes PXR, PXG, and PXB of the red pixel R, the green pixel G, and the blue pixel B is set to 160 nm, 130 nm, and 120 nm respectively, the number of droppings of the ink for pixel electrode is 16 drops, 13 drops, and 12 drops respectively. The area of the pixel electrode region in this example is about $0.002\ mm^2$.

Figure 16:
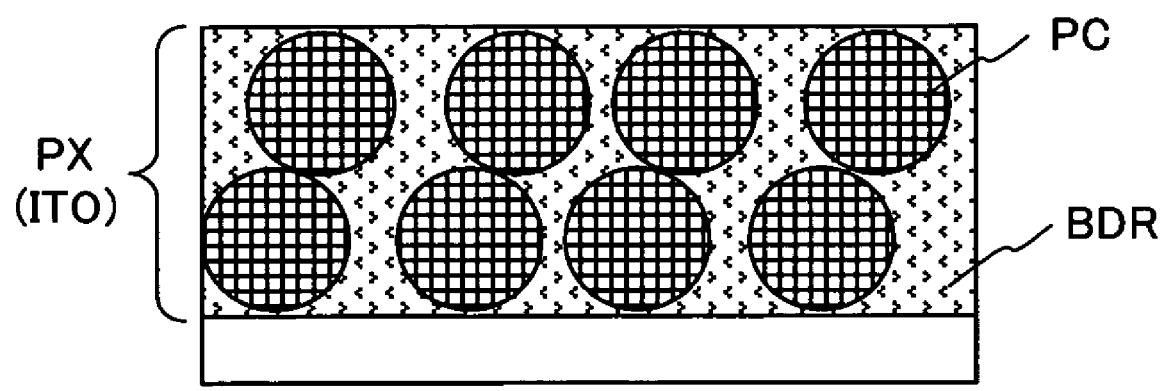
FIG. 16 is a schematical drawing to explain a method to vary the refractive index of the pixel electrode formed by ink jet method.

FIG. 16 is a schematical cross-sectional view to explain the method for varying the refractive index of the pixel electrode prepared by the ink jet method. ITO is used as the conductive fine particles PC. The refractive index of the transparent conductive film to make up the pixel electrode is a volume ratio of refractive index of each of the conductive fine particles PC and the binder BDR contained in it. For example, if a transparent conductive film contains conductive fine particles with refractive index 2.0 by 50% and a binder with refractive index 1.5 by 50%, the refractive index of the transparent conductive film is 1.75. Also, if a transparent conductive film contains conductive fine particles with refractive index 2.2 by 80% and a binder with refractive index 1.5 by 20%, the refractive index of the transparent conductive film is 2.06.

As the conductive fine particles, metal fine particles containing 1 or 2 or more selected from the following metals may be used in addition to ITO: metal oxides such as antimony-containing tin oxide (ATO), aluminum-containing zinc oxide, antimony-containing indium oxide (AIO), metals such as gold (Au), silver (Ag), platinum (Pt), ruthenium (Ru), rhodium (Rh), palladium (Pd), osmium (Os), iridium (Ir), etc.

As the binder as described above, organic or inorganic binders can be used. Organic resin may be used such as UV-setting resin, electron beam curing type resin, thermosetting resin, thermoplastic resin, etc. Above all, UV-setting resin is suitable because it is inexpensive and easily available. Also, it has high adhesive property with transparent material—in particular, transparent plastic base material, and it is suitable as the binder in the present invention.

As the UV-setting resin, a photosensitive resin used for wet coating may be used. For instance, a photosensitive resin such as acrylic resin, acryl-urethane type resin, silicone type resin, epoxy resin, etc. is suitable because it does not affect dispersion property of the conductive fine particles.

In the above, description has been given on the examples of the first transparent electrode (pixel electrode) in the first substrate. The same applies to the control of the film thickness and the refractive index of a second transparent electrode (counter electrode) used in the second substrate The present invention is not limited to the liquid crystal display device and may be applicable for the adjustment of chromaticity difference in the display device such as organic EL display device, in which display light passes through transparent conductive film, or in other electronic devices.

What is claimed is:

1. A display device, having pixels of 3 colors of red, green, and blue respectively to constitute color pixels, wherein:
    each of said pixels comprises a first transparent conductive film, a second transparent conductive film, a color filter, and a liquid crystal layer interposed between said first transparent conductive film and said second transparent conductive film;
    wherein the display device is provided with a first insulating substrate with said first transparent conductive film formed thereon, and a second insulating substrate with said second transparent conductive film deposited thereon;
    said first insulating substrate contains a thin-film transistor to perform pixel on-off control for each pixel;
    for each pixel said second insulating substrate has said color filter to allow light with a wavelength to match the color of said pixel to pass; and
    said first transparent conductive film is formed in island-like shape for each pixel;
    wherein said first transparent conductive film of island like shape for each pixel has a same film thickness, and has a refractive index which is different from each other.

2. A display device according to claim 1, wherein:
    said first transparent conductive film and said second transparent conductive film of the island-like shape have one of ITO, IZO or ITZO as main component.

3. A display device, wherein:
    there are provided at least a plurality of transparent conductive films having the same thickness and formed approximately in the same island-like shape on an insulating substrate;
    at least three of said plurality of transparent conductive films are set to one color pixel of different color, and light emitting layers each having different wavelength range are laminated on the island-like transparent conductive films in said one color pixel;
    when said light emitting layers in one color pixel are R, G, and B respectively, that the island-like transparent conductive films are aligned to the light emitting layers R, G, and B are ITOR, ITOG, and ITOB respectively, that a film thickness of each of ITOR, ITOG, and ITOB are dR, dG, and dB respectively, that the wavelength with highest transmissivity of the light emitting layers R, G, and B are λR, λG, and λB respectively, that a refractive index at the wavelength λR of ITOR is nR, a refractive index of ITOG at the wavelength λG is nG, and a refractive index of ITOB at the wavelength λB is nB;
    then, the refractive indices are so arranged that the following relation exists in the optical film thickness of the transparent conductive film determined by a product of refractive index and film thickness:

nRdR>nGdG>nBdB.

4. A display device according to claim 3, the refractive index of said first transparent conductive film of island like shape for their different color pixels is different from each other.

5. A display device, having pixels of 3 colors of red, green, and blue respectively to constitute color pixels, wherein:
    each of said pixels comprises a first transparent conductive film, a second transparent conductive film, a color filter, and a liquid crystal layer interposed between said first transparent conductive film and said second transparent conductive film;

wherein the display device is provided with a first insulating substrate with said first transparent conductive film formed thereon, and a second insulating substrate with said second transparent conductive film deposited thereon;

said first insulating substrate contains a thin-film transistor to perform pixel on-off control for each pixel;

for each pixel said second insulating substrate has said color filter to allow light with a wavelength to match the color of said pixel to pass; and said first transparent conductive film is formed in island-like shape for each pixel;

wherein said first transparent conductive film of island like shape for each pixel has a different film thickness, and has a refractive index for at least two of the color pixels which is different from each other.

6. A display device according to claim 5, wherein: the color filters of said pixels are RF, GF, and BF;

wherein said first transparent conductive film of island-like shape is aligned to said color filters RF, GF, and BF and respectively are PXR, PXG, and PXB;

wherein the film thickness of said first transparent conductive film PXR, PXG, and PXB are dR, dG, and dB respectively;

wherein the wavelength with highest transmissivity of said color filters RF, GR, and BF are $\lambda R$, $\lambda G$, and $\lambda B$ respectively, where $\lambda R > \lambda G > \lambda B$, and that wherein the refractive index at the wavelength $\lambda R$ of PXR is nR, the refractive index of PXG at a wavelength $\lambda G$ is nG, and the refractive index of PXB at a wavelength $\lambda B$ is nB so that;

the refractive indices and film thicknesses are arranged such that the following relation exists:

$nRdR > nGdG > nBdB.$

\* \* \* \* \*